(12) United States Patent
Park

(10) Patent No.: US 9,490,333 B2
(45) Date of Patent: Nov. 8, 2016

(54) ANTI-FUSE AND METHOD FOR FORMING THE SAME

(71) Applicant: SK hynix Inc., Icheon-si (KR)

(72) Inventor: Sung Hye Park, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/280,320

(22) Filed: May 16, 2014

(65) Prior Publication Data

US 2015/0236154 A1 Aug. 20, 2015

(30) Foreign Application Priority Data

Feb. 17, 2014 (KR) ........................ 10-2014-0017977

(51) Int. Cl.
*H01L 23/52* (2006.01)
*H01L 29/423* (2006.01)
*H01L 23/525* (2006.01)

(52) U.S. Cl.
CPC ....... *H01L 29/4236* (2013.01); *H01L 23/5252* (2013.01); *H01L 2924/0002* (2013.01)

(58) Field of Classification Search
CPC ............... H01L 27/11206; H01L 23/5252; H01L 29/4236; H01L 2924/3011; H01L 21/76888; H01L 27/112; G11C 17/16
See application file for complete search history.

(56) References Cited

U.S. PATENT DOCUMENTS

| | | | |
|---|---|---|---|
| 2006/0186487 A1* | 8/2006 | Lee | H01L 21/28123 257/411 |
| 2006/0216917 A1* | 9/2006 | Seo | H01L 29/66621 438/589 |
| 2007/0007571 A1* | 1/2007 | Lindsay | H01L 21/26586 257/306 |
| 2007/0152267 A1* | 7/2007 | Rouh | 257/330 |
| 2010/0308407 A1 | 12/2010 | Kreipl | |
| 2014/0027844 A1* | 1/2014 | Jung | H01L 29/42356 257/331 |

FOREIGN PATENT DOCUMENTS

KR 10-2014-0016068 A 2/2014

* cited by examiner

*Primary Examiner* — Daniel Luke
*Assistant Examiner* — Khatib Rahman

(57) ABSTRACT

An anti-fuse includes a first gate structure disposed in a semiconductor substrate and a second gate structure that is spaced apart from the first gate structure by a distance and disposed in the semiconductor substrate. The first and second gate structures have different depths from each other in the semiconductor substrate.

12 Claims, 10 Drawing Sheets

ANTI-FUSE AND METHOD FOR FORMING THE SAME

CROSS-REFERENCE TO RELATED APPLICATION

The present application claims priority to Korean Patent Application No. 10-2014-0017977, filed on 17 Feb. 2014, the disclosure of which is incorporated herein in its entirety by reference.

BACKGROUND

Embodiments of the present disclosure relate to an anti-fuse and a method for forming the same.

As computers have come into widespread use, semiconductor devices that can operate at a high speed and have a high storage capacity are increasingly in demand. Therefore, technology for manufacturing semiconductor devices has been developed to improve the degree of integration, reliability, response speed, etc. of the devices.

However, cells of semiconductor devices may have defects that occur in the process of manufacturing the semiconductor devices. The defective cells may be detected in early stages of the manufacturing process, and are replaced with redundancy cells by a repair process.

Anti-fuses are needed for such a repair process. Unlike laser fuses, which are cut by laser, anti-fuses are capable of being repaired at a package level, and thus have been widely used in various technical fields.

SUMMARY

Various embodiments of the present disclosure are directed to providing an anti-fuse and a method for forming the same, which substantially obviate one or more problems due to limitations and disadvantages of the related art.

Embodiments of the present disclosure relate to an anti-fuse, which is capable of easily rupturing a program gate and improving characteristics of a select gate, and a method for forming the same.

In accordance with an aspect of the present invention, an anti-fuse includes: a first gate structure disposed in a semiconductor substrate; and a second gate structure spaced apart from the first gate structure by a distance and disposed in the semiconductor substrate.

In accordance with another aspect of the present invention, a method for forming an anti-fuse, the method comprising: forming a first gate structure buried in a semiconductor substrate; and forming a second gate structure which is spaced apart from the first gate structure by a distance and buried in the semiconductor substrate.

The method further comprises: forming a source or drain regions in the semiconductor substrate at both sides of the first gate structure and the second gate structure; forming first and second metal contacts, the first and second metal contacts being coupled to the first gate structure and the second gate structure, respectively; forming a third metal contact coupled to the source or drain region formed at one side of the second gate structure, the one side of the second gate structure being opposite to the first gate structure.

The first gate structure is formed to have a smaller depth in the semiconductor substrate than the second gate structure.

The method further comprises: forming a first gate insulation film below the first gate structure, prior to formation of the first gate structure; and forming a second gate insulation film below the second gate structure prior to formation of the second gate structure, wherein the first gate insulation film has a smaller thickness than the second gate insulation film.

In accordance with another aspect of the present invention, a method for forming an anti-fuse includes: forming a first gate structure, a lower part of which includes a recess gate, over a semiconductor substrate of a peripheral region; and forming a second gate structure which is spaced apart from the first gate structure by a predetermined distance and is buried in the semiconductor substrate.

The first gate serves as a program gate and the second gate serves as a select gate, and wherein the first depth of the first recess is smaller than a second depth of the second recess.

It is to be understood that both the foregoing general description and the following detailed description of embodiments are not limiting, but are intended to provide further explanation of the invention as claimed.

DESCRIPTION OF EMBODIMENTS

Reference will now be made in detail to certain embodiments, examples of which are illustrated in the accompanying drawings. Wherever possible, the same reference numbers will be used throughout the drawings to refer to the same or like parts. In the following description, a detailed description of known configurations or functions incorporated herein will be omitted when it may make the subject matter less clear.

In general, an anti-fuse array includes a program transistor and a select transistor, and receives a voltage through a metal contact coupled to each transistor. In the anti-fuse array, a program transistor, a select transistor, and a bit line (metal contact) are selected to program a cell that will replace a defective cell.

If a high voltage is applied to an anti-fuse array through a metal contact coupled to a program gate, a gate insulation film of a program transistor will rupture. If a predetermined voltage is applied to the anti-fuse array through a metal contact of a select gate, a channel region is formed below the select gate, such that a voltage flowing through the program gate is applied to the anti-fuse array through the channel region located below the select gate. The gate insulation film of the program transistor may be formed with a small thickness to facilitate the rupturing of the gate insulation film, and a gate insulation film of the select transistor may be formed with a thickness equal to or greater than a predetermined value to ensure reliability. In addition, in order to improve rupture dispersion characteristics of the program gate, i.e., in order to facilitate the rupturing of the program gate, a channel length of the program gate may be reduced. In order to improve device characteristics of the select gate, a channel length of the select gate may be increased.

An anti-fuse and a method for forming the same according to embodiments will hereinafter be described with reference to FIGS. 1 to 6f.

Figure 1:
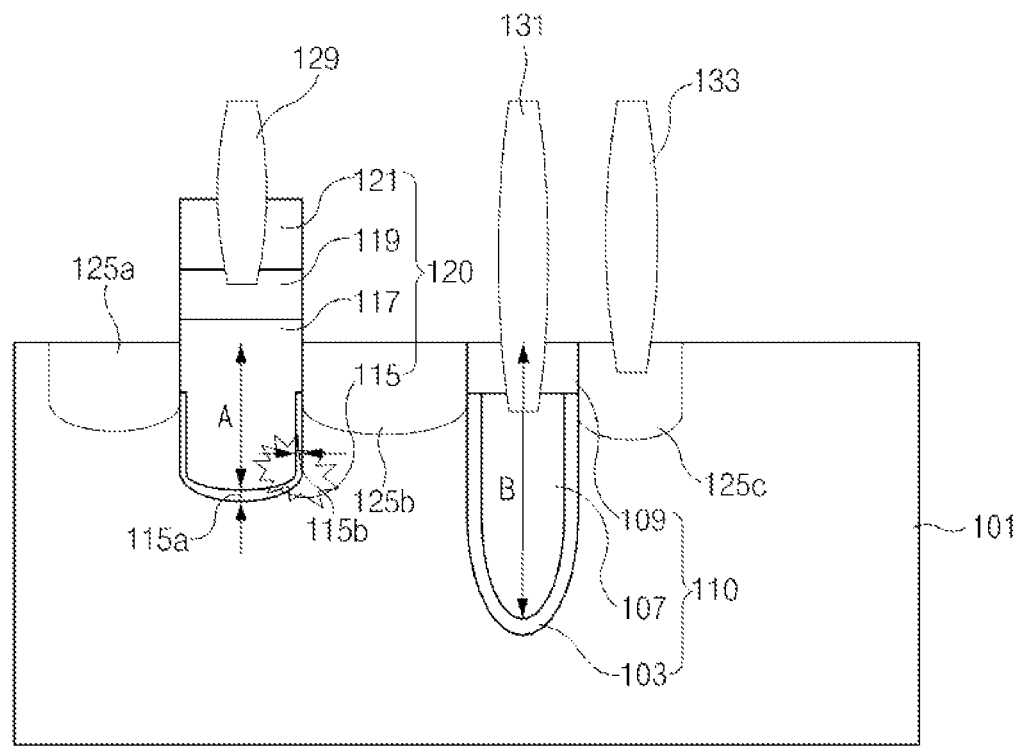
FIG. 1 is a cross-sectional view illustrating an anti-fuse according to an embodiment.

FIG. 1 is a cross-sectional view illustrating an anti-fuse according to an embodiment. The anti-fuse is formed in a peripheral (Peri) region, and includes a program gate 120 in the form of a recess gate, a select gate 110 in the form of a buried gate, source/drain regions 125a, 125b, and 125c, a first metal contact 129, a second metal contact 131, and a third metal contact 133.

The select gate 110 includes a gate insulation film 103, a conductive film 107, and a hard mask film 109 that are sequentially formed and disposed in a trench formed in a semiconductor substrate 101. The select gate 110 may be formed simultaneously with a buried gate of a cell region (not shown), and may be formed to have substantially the same length B and size as those of the buried gate of the cell region. A thickness of the gate insulation film 103 may be substantially identical to that of a gate insulation film included in the buried gate of the cell region.

The program gate 120 includes a gate insulation film 115, a first conductive film 117, a second conductive film 119, and a hard mask film 121 that are sequentially formed. In such a structure, the gate insulation film 115 and the first conductive film 117 are disposed in a recess formed in the semiconductor substrate 101, and the second conductive film 119 and the hard mask film 121 are disposed over the first conductive film 117 and have a predetermined pattern. That is, the second conductive film 119 and the hard mask film 121 are formed over the semiconductor substrate 101. In an embodiment shown in FIG. 1, the first conductive film 117, which is provided in the recess, extends out of the recess so that a top surface of the first conductive film 117 is disposed over an uppermost surface of the semiconductor substrate 101, and the second conductive film 119 and the hard mask film pattern 121 are disposed over the recess and over the first conductive film 117.

The program gate 120 may be formed simultaneously with a recess gate of a sense-amplifier (sense-amp) region (not shown), and a recess formed in the semiconductor substrate 101 may be formed to have a depth A smaller than the depth B of the trench in which the select gate 110 is formed. Accordingly, a channel length of the program gate 120 may be formed to be relatively short so that rupture dispersion characteristics can be improved.

The gate insulation film 115 of the program gate 120 is formed to have a smaller thickness than the gate insulation film 103 of the select gate 110, so that the gate insulation film 115 can be easily ruptured. When forming the gate insulation film 115 of the program gate 120, a bottom portion 115a of the gate insulation film 115 that is disposed on the bottom surface of the recess may have a thickness greater than that of a sidewall portion 115b of the gate insulation film 115 that is disposed on a sidewall of the recess. As a result, the sidewall portion 115b of the gate insulation film 115 can be more easily ruptured than the bottom portion 115a of the gate insulation film 115. A lower part of the recess in which the gate insulation film 115 and the first conductor film 117 of the program gate 120 is disposed is formed to be angular at its corner, and the bottom surface of the recess is formed to be relatively planar, so that the gate insulation film 115 located at the corner of the lower part of the recess can be easily ruptured. That is, in an embodiment, the lower corners of the recess have a relatively sharp curve, while the bottom surface of the recess has a relatively slight curve. Thus, in an embodiment, the gate insulation film 115 at the junction where the thicker bottom portion 115a of the gate insulation film 115 disposed at the bottom surface of the recess meets the thinner sidewall portion 115b of the gate insulation film 115 at the sidewall of the recess is narrower than portions of the gate insulation film 115 disposed over other surfaces of the recess.

After the program gate 120 and the select gate 110 are formed, the source/drain regions 125a, 125b, and 125c are formed at both sides of the program gate 120 and the select gate 110 by implanting ions into exposed portions of the semiconductor substrate 101. If the semiconductor substrate 101 includes a P-well, the source/drain regions 125a, 125b, and 125c may be formed by implanting $N^+$ ions into the exposed portions of the P-well.

The first metal contact 129 is coupled to the program gate 120, the second metal contact 131 is coupled to the select gate 110, and the third metal contact 133 is coupled to the source/drain region 125c. If a high voltage is applied to the first metal contact 129 and a low voltage is applied to the second metal contact 131, a current caused by rupture of the program gate 120 starts to flow through the third metal contact 133.

As described above, in an anti-fuse in accordance with an embodiment, the program gate 120 is formed in a recess gate structure, and the select gate 110 is formed in a buried gate structure. The depth A to which the program gate 120 extends into the semiconductor substrate 101 is smaller than the depth B to which the select gate 110 extends into the semiconductor substrate 101. Thus, a channel length of the select gate 110 is formed to be relatively long compared to a channel length of the program gate 120. As a result, device characteristics of the select gate 110 are improved. Moreover, since the channel length of the program gate 120 is formed to be relatively short, rupture characteristics of the program gate 120 are improved. In addition, since the program gate 120 is formed as a recess gate and the select gate 110 is formed as a buried gate, a width of a region occupied by the program gate 120 or the select gate 110 is smaller, and thus the space between the program gate 120 and the select gate 110 can be larger, resulting in an increase of resistivity. As a result, the select gate 110 may be less affected by a current generated when the gate insulation film 115 of the program gate 120 is ruptured.

Figure 2:
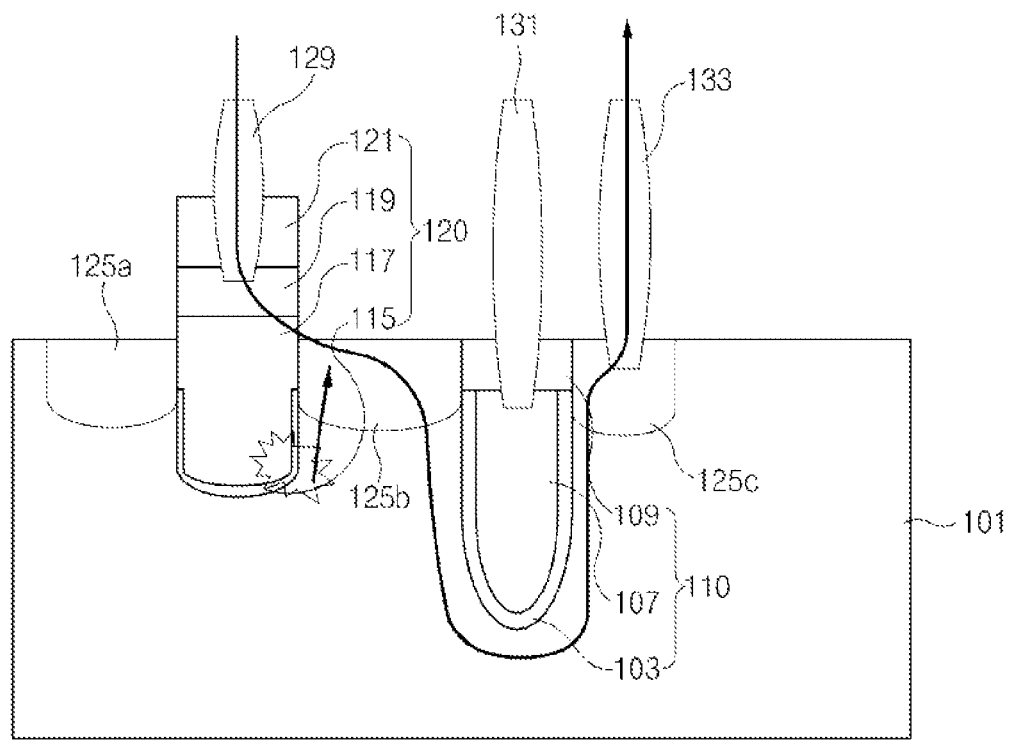
FIG. 2 is a view illustrating operations of the anti-fuse of FIG. 1 according to an embodiment.

FIG. 2 is a view illustrating operations of the anti-fuse of FIG. 1 according to an embodiment. The operations of the anti-fuse occurring when the program gate 120 is ruptured will hereinafter be described with reference to FIG. 2.

If a low voltage is applied to the select gate 110 and a high voltage is applied to the program gate 120, the gate insulation film 115 of the program gate 120 is ruptured. As a result, as can be seen from the path indicated by the arrow, a current path is formed through the source/drain region 125b, a channel region under the select gate 110, and the source/drain region 125c. Thus, a current flows from the first metal contact 129 to the third metal contact 133 along the current path.

Figure 3:
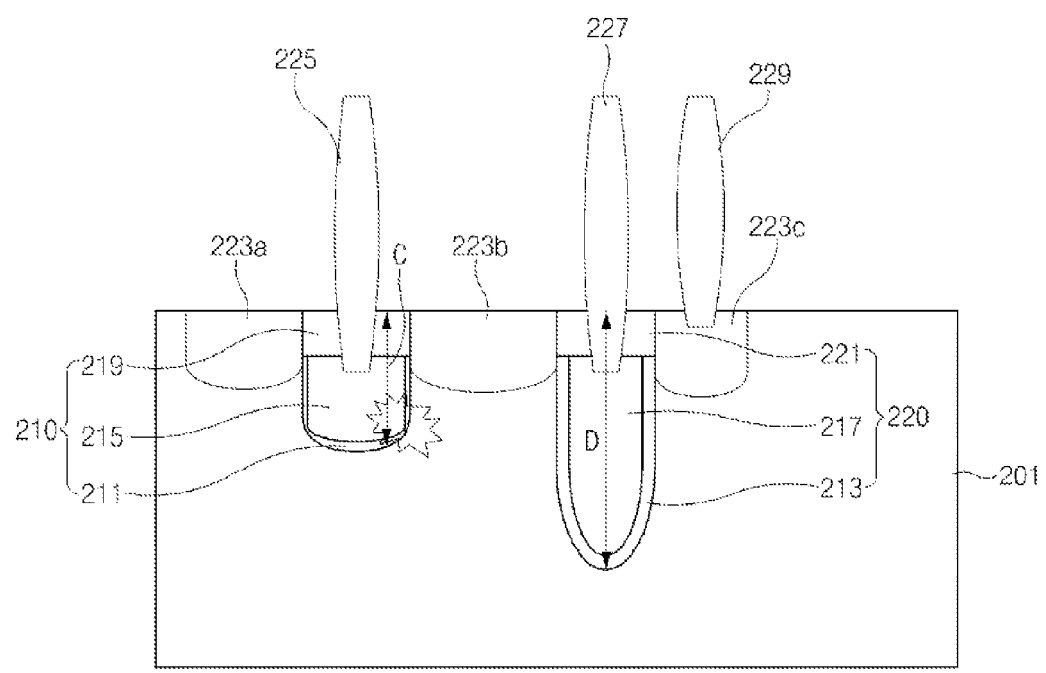
FIG. 3 is a cross-sectional view illustrating an anti-fuse according to another embodiment.

FIG. 3 is a cross-sectional view illustrating an anti-fuse according to another embodiment. The anti-fuse includes a program gate 210 formed as a buried gate, a select gate 220 formed as a buried gate, source/drain regions 223a, 223b, and 223c, a first metal contact 225, a second metal contact 227, and a third metal contact 229.

The program gate 210 includes a gate insulation film 211, a conductive film 215, and a hard mask film 219 that are sequentially formed and disposed in a first trench formed in a semiconductor substrate 201. The gate insulation film 211 and the conductive film 215 are formed at a lower portion of the first trench, and a hard mask film 219 is formed at an upper portion of the first trench. The gate insulation film 211 of the program gate 210 is formed to have a smaller thickness than the gate insulation film 213 of the select gate 220, such that the program gate 210 can be more easily ruptured. In addition, the lower portion of the first trench is formed to be angular at its corner. As a result, the gate insulation film 211 located at the corner of the lower portion of the first trench can be easily ruptured. Although not shown in FIG. 3, when forming the gate insulation film 211 of the program gate 210, a portion of the gate insulation film 211 disposed on the bottom surface of the first trench is formed to have a thickness greater than that of a portion of the gate insulation film 211 disposed on both sidewalls of the first trench. As a result, the portion of the gate insulation film 211 disposed on both sidewalls of the first trench may be more easily ruptured.

The select gate 220 includes a gate insulation film 213, a conductive film 217, and a hard mask film 221, which are sequentially formed and disposed in a second trench that is formed in the semiconductor substrate 201 and spaced apart from the first trench by a predetermined distance. The select gate 220 may be formed simultaneously with a buried gate of a cell region (not shown), and may have substantially the same dimensions as those of the buried gate of the cell region.

A depth C to which the program gate 210 extends in the semiconductor substrate 201 may be smaller than a depth D to which the select gate 220 extends in the semiconductor substrate 201. Thus a channel length of the program gate 210 is relatively short compared to a channel length of the select gate 220, resulting in improvement of rupture dispersion characteristics of the program gate 210. In addition, since the select gate 220 is formed in a buried gate structure having a larger depth than the program gate 210, the channel length of the select gate 220 is longer than that of the program gate 210, resulting in an increase of device reliability.

After the program gate 210 and the select gate 220 are formed, the source/drain regions 223a, 223b, and 223c are formed at both sides of the program gate 210 and the select gate 220 by implanting ions into exposed portions of the semiconductor substrate 201. If the semiconductor substrate 201 includes a P-well, the source/drain regions 223a, 223b, and 223c may be formed by implanting $N^+$ ions into the exposed portions of the P-well.

The first metal contact 225 is coupled to the program gate 210, the second metal contact 227 is coupled to the select gate 220, and the third metal contact 220 is coupled to the source/drain region 223c.

As described above, an anti-fuse according to another embodiment includes the program gate 210 and the select gate 220, both of which are in the form of a buried gate. Therefore, each of the program gate 210 and the select gate 220 can be formed in a small area, and the program gate 210 and the select gate 220 can be formed to have a larger space therebeween. Therefore, when an excessive current flows, since the space between the program gate 210 and the select gate 220 serves as a resistance element having a larger resistance value, the select gate 220 is protected from the excessive current, and thus the reliability of the select gate 220 may be improved. In addition, since the depth C of the program gate 210 is smaller than the depth D of the select gate 220, the channel length of the select gate 220 may be longer than that of the program gate 210, such that device characteristics of the select gate 220 are improved. At the same time, the channel length of the program gate 210 is shorter than that of the select gate 220, resulting in improvement of rupture characteristics of the program gate 210.

Figure 4:
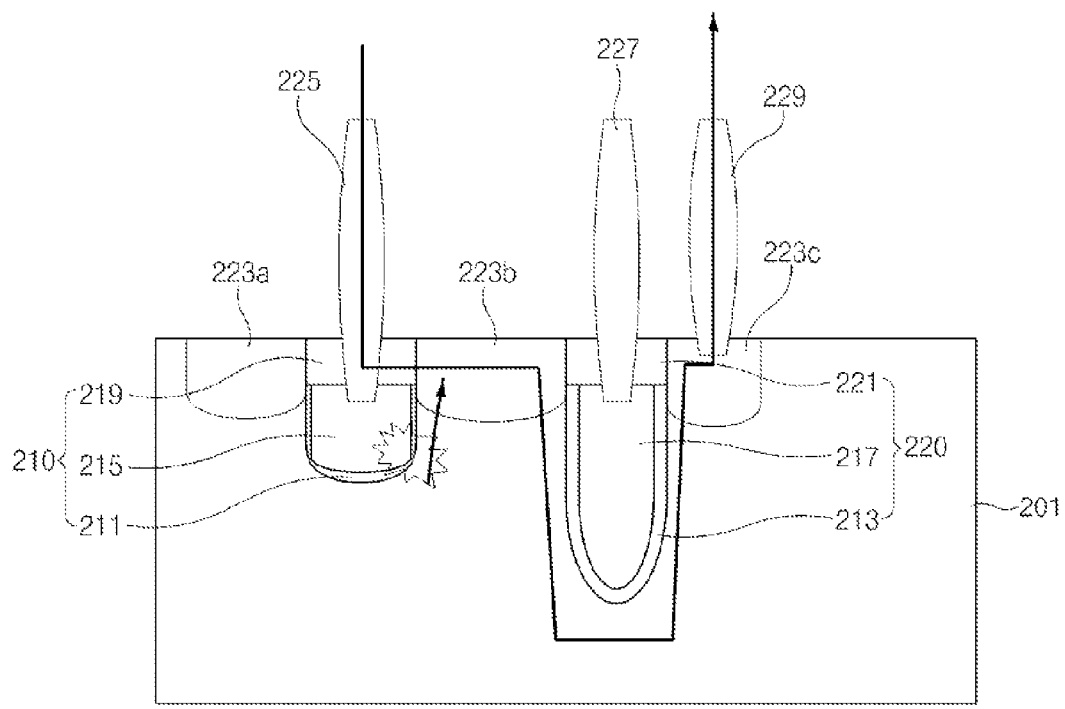
FIG. 4 is a view illustrating operations of the anti-fuse of FIG. 3 according to an embodiment.

FIG. 4 is a view illustrating operations of the anti-fuse of FIG. 3 according to an embodiment. The operations of the anti-fuse when the program gate 210 is ruptured will hereinafter be described with reference to FIG. 4.

If a low voltage is applied to the select gate 220 and a high voltage is applied to the program gate 210, the gate insulation film 211 of the program gate 210 is ruptured. As a result, as can be seen from the direction and course of the path indicated by the arrow, a current path is formed through the source/drain region 223b, a channel region under the select gate 220, and the source/drain region 223c, and thus a current flows from the first metal contact 225 to the third metal contact 229 along the current path.

As described above, an anti-fuse according to another embodiment includes the program gate 210 and the select gate, 220 both of which are in the form of a buried gate instead of a planar gate. Each of the program gate 210 and the select gate 220 is formed in an area having a small width, and thus the program gate 210 and the select gate 220 can be formed to have a larger space therebeween. Since the space between the program gate 210 and the select gate 220 serves as a resistance element having a larger resistance value, an excessive current flowing when the program gate 210 is ruptured has a minimal effect on the select gate 220.

In addition, the gate insulation film 211 of the program gate 210 and the gate insulation film 213 of the select gate 220 are different in thickness from each other. In an embodiment, the gate insulation film 213 of the select gate 220 is formed to have a greater thickness than the gate insulation film 211 of the program gate 210. As a result, the gate insulation film 211 of the program gate 210 can be easily ruptured, and the gate insulation film 213 of the select gate 220 may be less affected by a current flowing when the gate insulation film 211 of the program gate 210 is ruptured.

Moreover, the select gate 220 and the program gate 210 are formed to have different depths. The deeper the select gate 220, the longer the channel length of the select gate 220, so that device characteristics of the select gate 220 can be improved. Since, as the channel length of the program gate 210 is longer, rupture dispersion characteristics of the program gate 210 are deteriorated. In addition, the program gate 210 is formed to have a smaller depth. As a result, the channel length of the program gate 210 is relatively short, and thus the rupture dispersion characteristics of the program gate 210 are improved.

FIGS. 5a to 5f are cross-sectional views illustrating a method for forming the anti-fuse of FIG. 1 according to an embodiment.

Figure 5A:
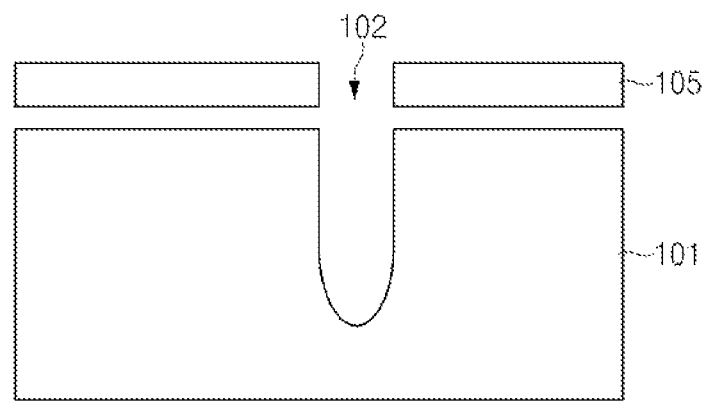
FIGS. 5*a* to 5*f* are cross-sectional views illustrating a method for forming the anti-fuse of FIG. 1 according to an embodiment.

Referring to FIG. 5a, a mask 105 for forming a buried gate is disposed over a semiconductor substrate 101, and the semiconductor substrate 101 exposed by the mask 105 is etched, such that a trench 102 for forming a buried gate is formed in the semiconductor substrate 101.

Figure 5B:
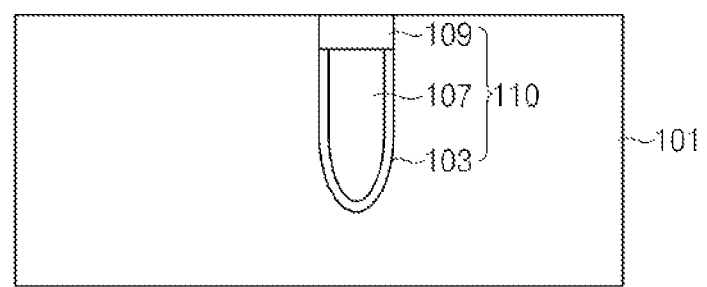

Referring to FIG. 5b, after a gate insulation material is deposited along an exposed surface of a structure including the trench 102 and then planarized until the deposited gate insulation material remains only in the trench 102 to form a gate insulation film 103. In an embodiment, the trench 102 is used for forming a select gate 110, and may have substantially the same dimensions as a trench for a buried gate that is simultaneously formed in a cell region. In addition, the gate insulation film 103 may have substantially the same thickness as that of a gate insulation film 103 formed when the buried gate of the cell region is formed.

Subsequently, a conductive material is deposited over the gate insulation film 103 of the trench 102 and then etched back. As a result of the etch-back process, upper portions of the gate insulation film 103 and the conductive film 107 formed in the trench 102 are removed, and thus the gate insulation film 103 and the conductive film 107 remain at middle and lower portions of the trench 102, while upper portions of the sidewalls of trench are exposed.

Subsequently, a hard mask material is deposited over the resulting structure including the conductive film 107 and then planarized so that the semiconductor substrate 101 is exposed and the hard mask material remains in the trench. Thus, a hard mask film 109 is formed over the conductive film 107 and in the trench 102. Accordingly, a buried gate composed of the conductive film 107 and the hard mask film 109 is formed as the select gate 110. The conductive film 107 may include one or more of a metal material, such as tungsten (W), titanium (Ti), titanium nitride (TiN), or the like, and a polysilicon material. The hard mask film 109 may include a nitride or oxide film serving as a capping film, and the gate insulation film 103 may be formed of an oxide film.

In an embodiment, the gate insulation film 103 of the select gate 110 is formed to have a thickness sufficient to secure the reliability of the select gate 110. That is, the select gate 110 is formed to have a relatively large thickness, such that the select gate 110 may be less affected by an input current flowing when the anti-fuse is ruptured. Because of the large thickness of the gate insulation film 103, the reliability of the select gate 110 is secured. In addition, in an embodiment, the select gate 110 is formed to have a channel length that is longer than that of a planar gate. Accordingly, device characteristics of the select gate 110 are improved.

Figure 5C:
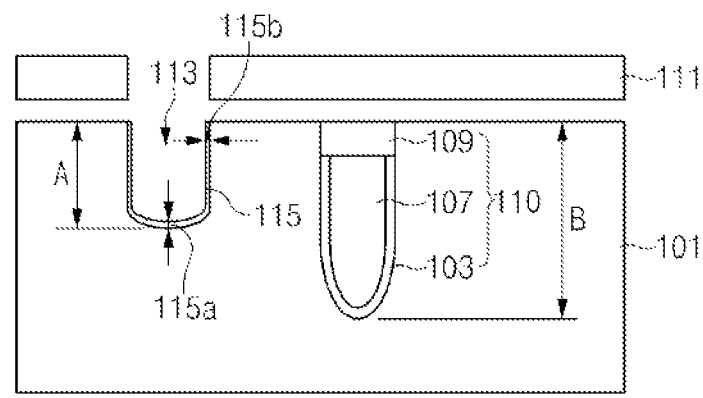

Referring to FIG. 5c, in order to form a program gate 120, a mask 111 for forming the program gate 120 is disposed over a structure including the select gate 110, and an exposed portion of the semiconductor substrate 101 that is neighboring the select gate 110 is etched so that a recess 113 is formed in the semiconductor substrate 101. In an embodiment, a depth A of the recess 113 is smaller than a depth B of the trench 102.

Subsequently, a gate insulation material is deposited along a surface of the resulting structure including the recess 113 and then planarized, and thus, the deposited gate insulation material remains only in the recess 113 forming a gate insulation film 115. In an embodiment, a bottom portion 115a of the gate insulation film 115, which is formed on the bottom surface of the recess 113, has a thickness greater than that of a sidewall portion 115b of the gate insulation film 115, which is formed on a sidewall of the recess 113. As a result, the sidewall portion 115b of the gate insulation film 115 formed on the sidewall can be easily ruptured compared to the bottom portion 115a of the gate insulation film 115 formed on the bottom surface. In an embodiment, the recess 113 for the program gate 120 is formed simultaneously with a recess gate of a sense-amplifier (sense-amp) region (not shown).

Figure 5D:
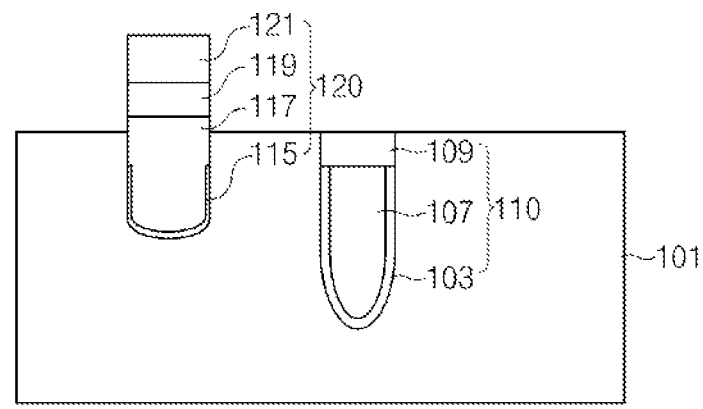

Referring to FIG. 5d, the gate insulation film 115 is etched back and may be slimmed, and thus an sidewall portion 115b of the gate insulation film 115 formed on the sidewall of the recess 113 are removed. As a result, the gate insulation film 115 may remain on mid- and lower portions of the sidewall and the bottom surface of the recess 113. Thereafter, first and second conductive films 117 and 119) and a hard mask film 121 are sequentially deposited over a structure including the recess 113 in which the gate insulation film 115 is formed, and then patterned so that the program gate 120 is formed. The program gate 120 includes the gate insulation film 115, the first and second conductive films 117 and 119, and the hard mask film 121. In an embodiment, the recess 113 is filled entirely with the first conductive film 117, and the second conductive film 119 and the hard mask film 121 are sequentially formed in a stack over the first conductive film 117.

The gate insulation film 115 of the program gate 120 may be smaller than the gate insulation film 103 of the select gate 110, such that the gate insulation film 115 is more easily ruptured.

Figure 5E:
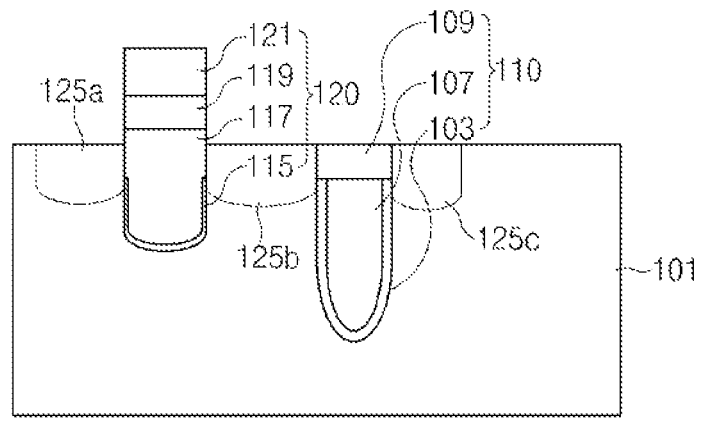

Referring to FIG. 5e, ions are implanted into exposed portions of the semiconductor substrate 101 so that source/drain regions 125a, 125b, and 125c are formed in the semiconductor substrate 101 at both sides of the program gate 120 and the select gate 110. In an embodiment, if the semiconductor substrate 101 includes a P-well, $N^+$ ions are implanted into the exposed portions of the semiconductor substrate 101 to form the source/drain regions 125a, 125b, and 125c.

Figure 5F:
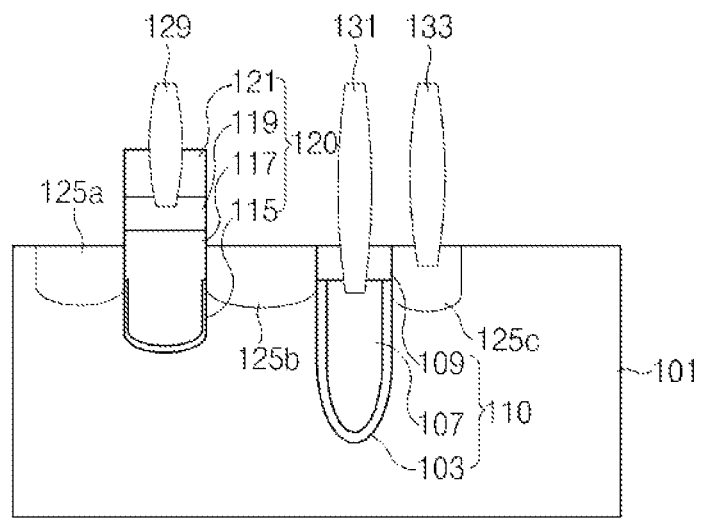

Referring to FIG. 5f, a first metal contact 129 and a second metal contact 131 are formed. The first metal contact 129 and the second metal contact 131 are coupled to the program gate 120 and the select gate 110, respectively. A third metal contact 133 coupled to the source/drain region 125c is formed.

To form the metal contacts 129, 131, and 133, after an interlayer insulation film (not shown) is deposited over an entire surface of the semiconductor substrate 101 including both the select gate 110 and the program gate 120, the interlayer insulation film is etched to form contact holes (not shown), and a conductive material is deposited in and over the contact holes, such that the first metal contact 129, the second metal contact 131, and the third metal contact 133 are formed.

When forming the second metal contact 131 in the select gate 110, portions of the hard mask film 109 and of the conductive film 107 are etched to form a metal contact hole (not shown), such that the second metal contact 131 can be coupled to the conductive film 107. In an embodiment, the second metal contact 131 directly contacts the conductive film 107. In an embodiment, the second metal contact 131 extends into a portion of the conductive film 107. When forming the first metal contact 129 in the program gate 120, portions of the hard mask film 121 and the second conductive film 119 are etched to form a metal contact hole (not shown), such that the first metal contact 129 can be coupled to the conductive film 119. In an embodiment, the first metal contact 129 directly contacts the second conductive film 119. In an embodiment, the first metal contact 129 extends into a portion of the second conductive film 119.

As described above, the program gate 120 is formed to have a recess gate structure, and the select gate 110 is formed to have a buried gate structure, such that each gate is formed in a smaller area and thus the space between the gates can increase. As a result, the select gate 110 may be less affected by an excessive current flowing when the gate insulation film 115 of the program gate 120 is ruptured, such that the reliability of the select gate 110 can be improved.

In addition, the gate insulation film 115 of a program gate 120 is formed to have a smaller thickness, and thus the gate insulation film can be easily ruptured. The gate insulation film 103 of a select gate 110 is formed to have a larger thickness, and thus the reliability of the select transistor is improved. Moreover, since the select gate 110 and the program gate 120 are formed to different depths, it is possible to form the channel length of the select gate 110 to be relatively long and the channel length of the program gate 120 to be relatively short. As a result, device characteristics of the select gate 110 can be improved and rupture dispersion characteristics of the program gate 120 can be improved.

FIGS. 6a to 6f are cross-sectional views illustrating a method for forming the anti-fuse of FIG. 3 according to an embodiment.

Figure 6A:
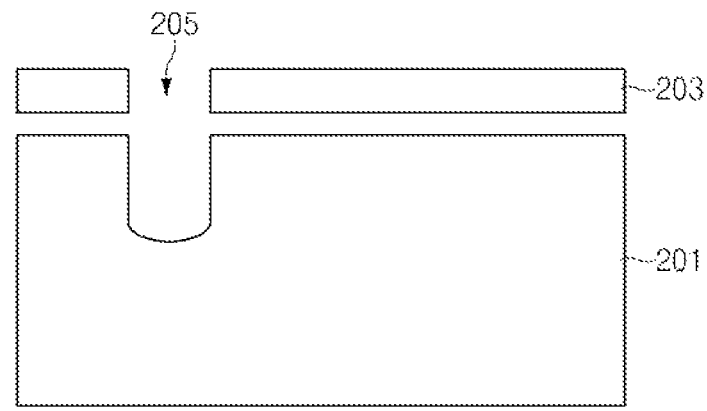
FIGS. 6*a* to 6*f* are cross-sectional views illustrating a method for forming the anti-fuse of FIG. 3 according to an embodiment.

Referring to FIG. 6a, a mask 203 for forming a program gate is disposed over a semiconductor substrate 201, and a portion of the semiconductor substrate 201 that is exposed by the mask 203 is etched, such that a first trench 205 for forming the program gate is formed. In an embodiment, a profile of the first trench 205 may be angular so that an electric field is concentrated on a corner (or edge) of the first trench 205. Accordingly, a gate insulation film (not shown) can be more easily ruptured by the electric field.

Figure 6B:
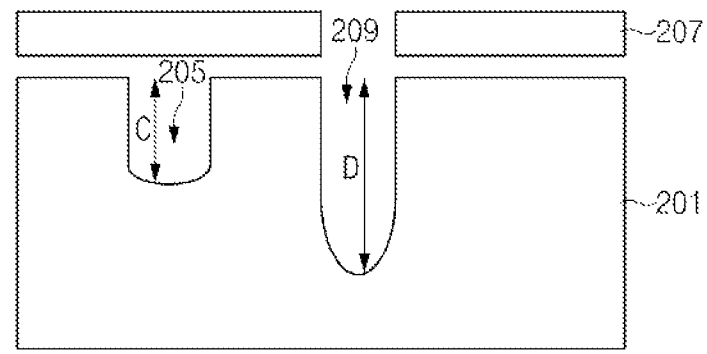

Referring to FIG. 6b, a mask 207 for forming a select gate is disposed over the semiconductor substrate 201 including the first trench 205, and a portion of the semiconductor substrate 201 that is exposed by the mask 207 is etched. As a result, a second trench 209 is formed to be spaced apart from the first trench 205 by a predetermined distance. The second trench 209 for forming the select gate may be formed simultaneously with a buried gate of a cell region (not shown). As can be seen from FIGS. 6a and 6b, if the first trench 205 for the program gate is formed first and then the second trench 209 for the select gate is formed, a cleaning process is performed two times, each cleaning process being performed after completion of each of the etch-back processes for forming the first and second trenches 205 and 209. As a result, surface characteristics of the semiconductor substrate 201 may be deteriorated, and thus a gate insulation film (not shown) of the program gate may be easily ruptured.

A depth D of the second trench 209 for forming the select gate may be larger than a depth C of the first trench 205 for forming the program gate. That is, the select gate may be formed to have a large depth so as to increase a channel length, such that device characteristics of the select gate can be improved. The program gate is not as deep, reducing a channel length, so that rupture dispersion characteristics of the program gate can be improved.

Figure 6C:
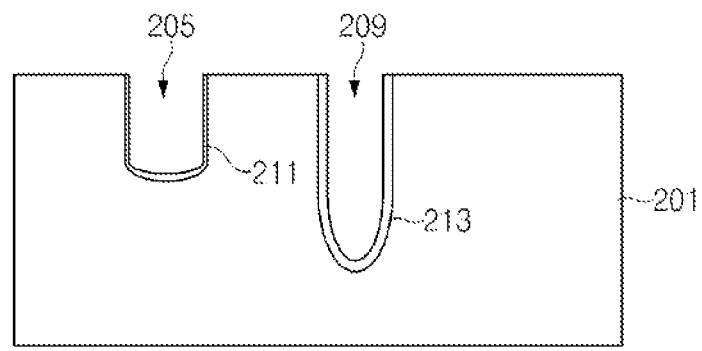

Referring to FIG. 6c, after a gate insulation material is deposited over a structure including the first and second trenches 205 and 209 and then planarized, gate insulation films 211 and 213 are formed. The gate insulation films 211 and 213 remain only on bottom surfaces and sidewalls of the first and second trenches 205 and 209, respectively. In an embodiment, the gate insulation film 211 on the bottom surface of the first trench 205 is formed to have a large thickness, whereas the gate insulation film 211 on the sidewall of the first trench 205 is formed to have a small thickness. As a result, when a voltage is applied, electrons are concentrated on the gate insulation film 211 on the sidewall, so that the gate insulation film 211 is easily ruptured.

Figure 6D:
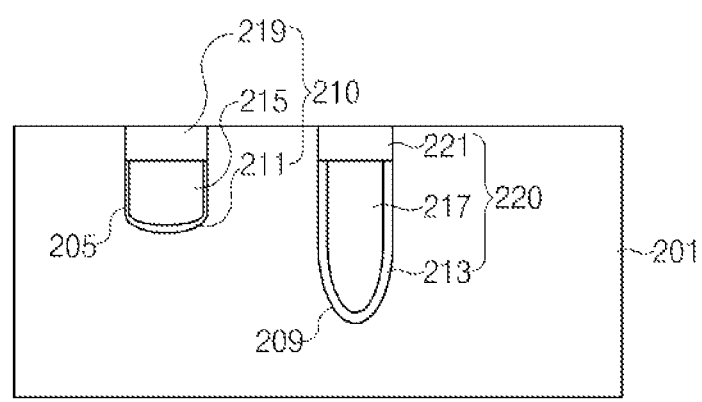

Referring to FIG. 6d, a conductive material is deposited over the gate insulation films 211 and 213 of the first and second trenches 205 and 209 so that conductive films 215 and 217 are respectively formed. After that, hard mask films 219 and 221 are deposited over the conductive films 215 and 217. The conductive films 215 and 217 and the hard mask films 219 and 221 are formed to fill the first and second trenches 205 and 209. Accordingly, a program gate 210 and the select gate 220 having different depths are formed in as buried gates in the semiconductor substrate 201.

Figure 6E:
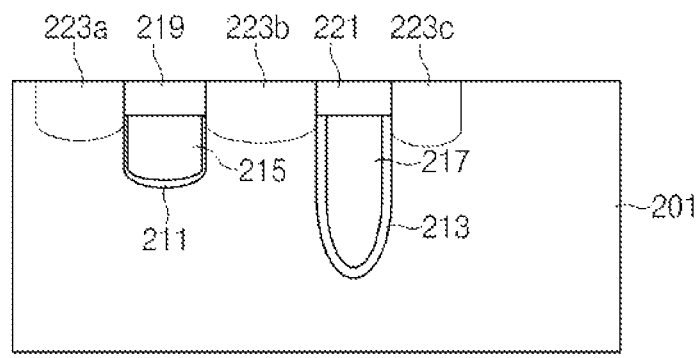

Referring to FIG. 6e, ions are implanted into exposed portions of the semiconductor substrate 201 including the program gate 210 and the select gate 220, resulting in formation of source/drain regions 223a, 223b, and 223c at both sides of the program gate 210 and the select gate 220. In an embodiment, if the semiconductor substrate 201 includes a P-well, $N^+$ ions are implanted into the exposed portions of the semiconductor substrate 201 to form the source/drain regions 223a, 223b, and 223c.

Figure 6F:
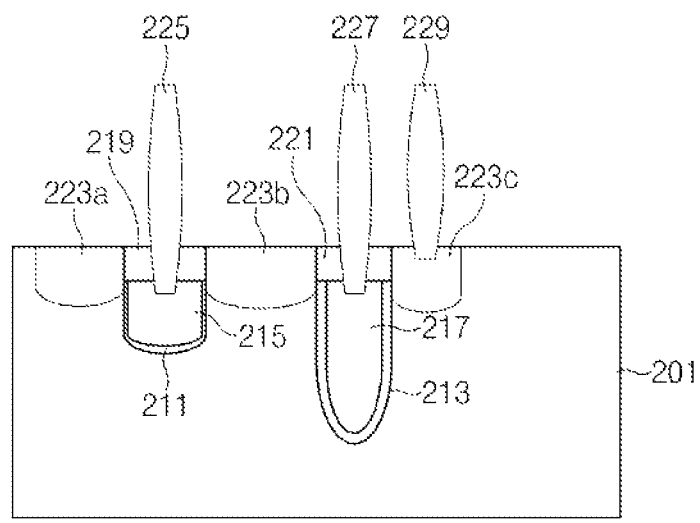

Referring to FIG. 6f, a first metal contact 225 and a second metal contact 227 are respectively formed to be coupled to the buried gates, i.e., the program gate 210 and the select gate 220, and a third metal contact 229 is formed to be coupled to the source/drain region 223c.

To form the metal contacts 225, 227, and 229, after an interlayer insulation film (not shown) is deposited over an entire surface of the semiconductor substrate 201 including both the buried gates 210 and 220, the interlayer insulation film is etched to form contact holes (not shown), and a conductive material is deposited in and over the contact hole, such that the first metal contact 225, the second metal contact 227, and the third metal contact 229 are formed.

When forming the first metal contact 225 and the second metal contact 227 respectively in the buried gates 210 and 220, portions of the hard mask films 219 and 221 and the conductive films 215 and 217 are etched to form contact holes (not shown), such that the first metal contact 225 and the second metal contact 227 can be coupled to the conductive films 215 and 217, respectively.

As described above, embodiments of the present disclosure relate to an anti-fuse including a program gate and a select gate. The program gate is formed as a recess gate structure or a buried gate structure, and the select gate is formed as a buried gate structure.

A space between the program gate and the select gate is relatively large since the program gate and the select gate are formed as a recess gate and/or a buried gate. As a result, an excessive current flowing from the program gate to the select gate when the program gate is ruptured is substantially reduced because of a large resistance value at the space, and thus the reliability of the select gate is improved.

Moreover, since the select gate is formed to have a large depth and the program gate is formed to have a small depth, a channel length of the select gate is increased, thus improving device characteristics of the select gate. In addition, rupture dispersion characteristics of the program gate are improved by reducing a channel length of the program gate.

In addition, since a gate insulation film of the select gate is formed to have a large thickness, the gate insulation film is minimally affected by an excessive current flowing when the program gate is ruptured. Since a gate insulation film of the program gate is formed to have a small thickness, the program gate is more easily ruptured.

In forming the program gate, a lower portion of a recess or trench is formed to be angular at its corner, so that the program gate can be easily ruptured at the corner. The gate insulation film on the bottom surface of the recess or trench is formed to have a larger thickness than the gate insulation film on a sidewall of the recess or trench, such that the gate insulation film on the sidewall is more easily ruptured.

Those skilled in the art will appreciate that embodiments of the present disclosure may be carried out in specific ways other than those set forth herein without departing from the spirit and essential characteristics of the present invention. The above embodiments are therefore to be construed in all aspects as illustrative and not restrictive. The scope of the invention should be determined by the appended claims and their legal equivalents, not by the above description. All changes coming within the meaning and equivalency range of the appended claims are intended to be embraced therein. Also, it is obvious to those skilled in the art that claims that are not explicitly cited in each other in the appended claims may be presented in combination as an embodiment of the present invention or included as a new claim by a subsequent amendment after the application is filed.

The above embodiments are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a volatile memory device or non-volatile memory device. Other additions, subtractions, or modifications are obvious in view of the present disclosure and are intended to fall within the scope of the appended claims.

What is claimed is:

1. An anti-fuse comprising:
   a program gate at least a portion of which is buried in a semiconductor substrate, the program gate having a first depth; and
   a select gate horizontally spaced apart from the program gate by a distance and buried in the semiconductor substrate, the select gate having a second depth,
   wherein the first depth of the program gate is smaller than the second depth of the select gate, and
   wherein a first channel length of the program gate is smaller than a second channel length of the select gate.

2. The anti-fuse according to claim 1, further comprising:
   first and second metal contacts respectively coupled to the program gate and the select gate; and
   a third metal contact coupled to a drain region or source region disposed at one side of the select gate opposite to the program gate.

3. The anti-fuse according to claim 1, wherein the program gate and the select gate each have a buried gate structure.

4. The anti-fuse according to claim 3, wherein the program gate includes:
   a first gate insulation film disposed along a bottom surface and a sidewall of a first trench in the semiconductor substrate;
   a first conductive film filling a portion of the first trench in which the first gate insulation film is disposed; and
   a first hard mask film disposed over the first conductive film and filling the remaining portion of the first trench.

5. The anti-fuse according to claim 4, wherein the select gate includes:
   a second gate insulation film disposed along a bottom surface and a sidewall of a second trench in the semiconductor substrate;
   a second conductive film filling a portion of the second trench in which the second gate insulation film is disposed; and
   a second hard mask film disposed over the second conductive film and filling the remaining portion of the second trench.

6. The anti-fuse according to claim 5, wherein the first gate insulation film has a smaller thickness than the second gate insulation film.

7. The anti-fuse according to claim 4, wherein the second gate insulation film has substantially the same thickness as that of a gate insulation film of a buried gate disposed in a cell region of a semiconductor device.

8. The anti-fuse according to claim 5, wherein:
   if the first gate insulation film is ruptured by a program voltage applied thereto, a current path is generated through a channel region that corresponds to a portion of the semiconductor substrate adjacent to the second gate insulation film.

9. The anti-fuse according to claim 4, wherein a first portion of the first gate insulation film disposed on the bottom surface of the first trench has a larger thickness than a second portion of the first gate insulation film disposed on the sidewall of the first trench.

10. The anti-fuse according to claim 1, wherein the program gate includes a recess gate structure and the select gate includes a buried gate structure.

11. The anti-fuse according to claim 10, wherein the program gate structure includes:
    a first gate insulation film disposed along the bottom surface and portions of a sidewall of a recess in the semiconductor substrate;
    a first conductive film filling the recess in which the first gate insulation film is disposed;
    a second conductive film having a predetermined pattern and disposed over the first conductive film; and
    a first hard mask film having the predetermined pattern and disposed over the second conductive film.

12. The anti-fuse according to claim 10, wherein the select gate includes:
    a second gate insulation film disposed along a bottom surface and portions of a sidewall of a trench in the semiconductor substrate;
    a second conductive film disposed to fill a portion of the trench in which the second gate insulation film is disposed; and
    a second hard mask film disposed over the conductive film and filling the remaining portion of the trench.

* * * * *